(12) United States Patent
Haimi-Cohen

(10) Patent No.: US 6,545,616 B1
(45) Date of Patent: Apr. 8, 2003

(54) METHODS AND APPARATUS FOR DIGITAL WIRELESS TEXT TELEPHONY

(75) Inventor: Raziel Haimi-Cohen, Springfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/334,017

(22) Filed: Jun. 15, 1999

Related U.S. Application Data

(60) Provisional application No. 60/093,403, filed on Jul. 20, 1998.

(51) Int. Cl.[7] .................................................. H03M 7/00
(52) U.S. Cl. ......................................... 341/91; 714/786
(58) Field of Search ............................. 341/91; 714/786, 714/774, 795, 794, 792, 746

(56) References Cited

U.S. PATENT DOCUMENTS 6,351,495 B1 * 2/2002 Tarraf .......................... 375/259
6,381,472 B1 * 4/2002 LaMedica, Jr. et al. ...... 455/560

* cited by examiner

*Primary Examiner*—Peguy JeanPierre
(74) *Attorney, Agent, or Firm*—Priest & Goldstein, PLLC

(57) ABSTRACT

A repeater for use in a digital wireless teletype-capable telephone receiver. The repeater includes a receiver for receiving an input signal and interpreting the input signal to identify Baudot characters represented by the input signal, and produce a receiver signal comprising identifications of the Baudot characters represented by the input signal. The repeater also comprises a transmitter which produces an output signal based on the receiver signal produced by the receiver. The transmitter generates the Baudot codes identified to it by the receiver. The repeater therefore removes distortion which may be present in the input signal.

24 Claims, 11 Drawing Sheets

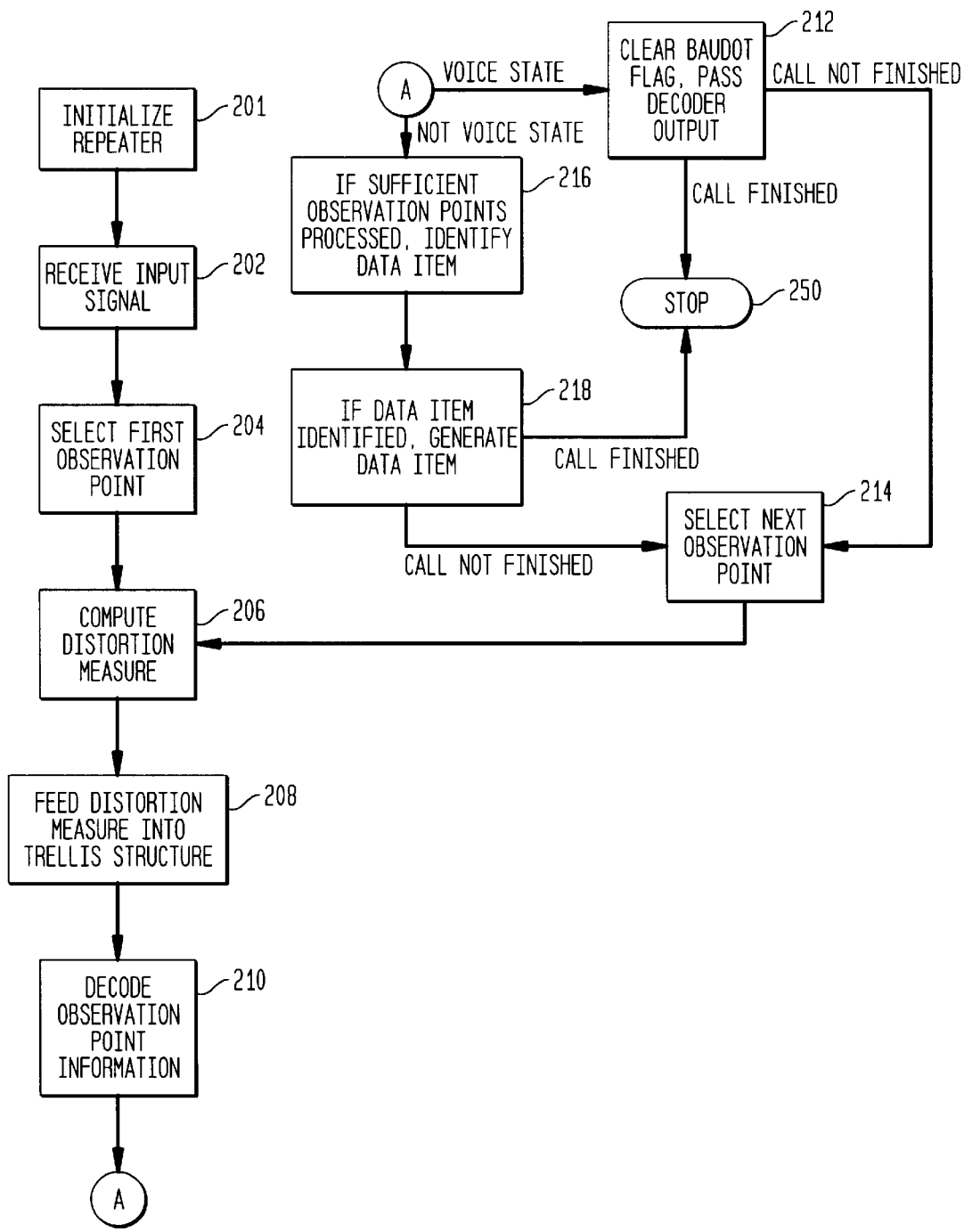

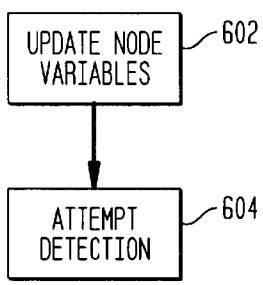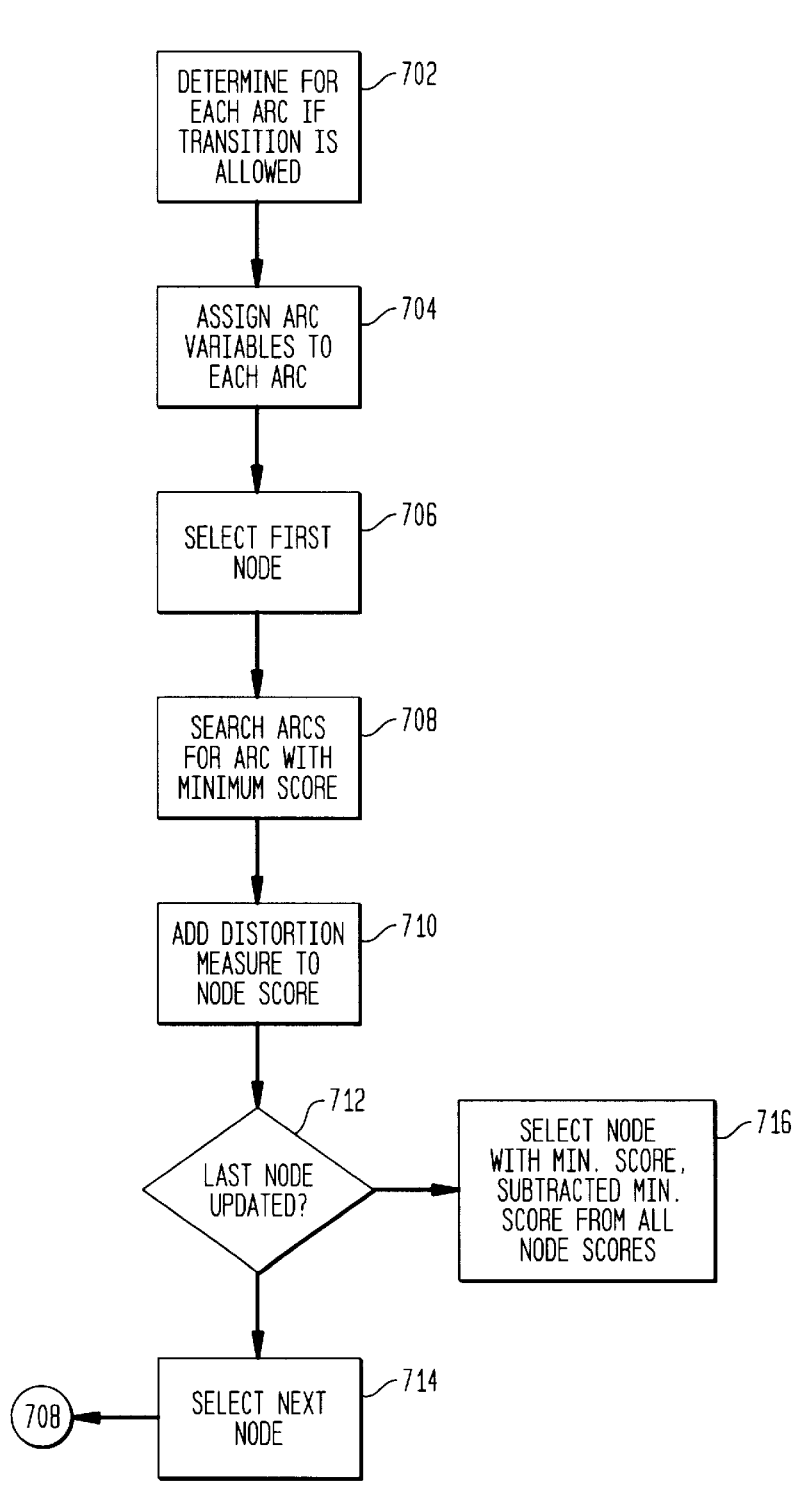

METHODS AND APPARATUS FOR DIGITAL WIRELESS TEXT TELEPHONY

This application claims the benefit of U.S. Provisional Application Ser. No. 60/093,403, filed Jul. 20, 1998.

FIELD OF THE INVENTION

The present invention relates generally to improvements in digital wireless telephony. More particularly, the invention relates to advantageous aspects of receivers and repeaters for removing distortion from Baudot-encoded text telephony signals in a digital wireless telephony system.

BACKGROUND OF THE INVENTION

Text telephony (TTY) is a technique developed to aid communication by persons who have difficulty using ordinary telephone equipment, typically because of difficulties with speech or hearing. Communication is accomplished by transmitting text messages over the telephone network, using special equipment to allow generation and transmission of text. The typical text telephony connection allows the choice of two-way text communication, or the use of voice communication by one party and text communication by the other.

TTY requires special terminal devices on both ends of the telephone line. One possible device is a teletype, which consists of a keyboard and a display, sometimes also including a printer. The teletype is connected to a telephone set via acoustic coupling or an RJ11 connector. Some teletypes are portable and lightweight, sometimes weighing less than a pound, and are well suited to work with mobile terminals. Another suitable device is an integrated teletype and telephone, which can perform both voice and text telephony. An additional existing device is a TTY modem which converts a personal computer (PC) into a TTY device. This modem serves as an interface between the PC and the telephone line, and allows the PC to operate as a TTY device. In particular, it performs encoding and decoding between ASCII character streams and TTY signals. A further device is an analog cellular phone adapter. This is a brand and model specific adapter which connects the RJ11 port on a teletype to a connection in a digital cellular phone.

In text telephony, the text messages are usually encoded using frequency shift key (FSK) modulation, and are transmitted over the telephone line and decoded at a receiver. TTY signals are transparent to the telephone network and are treated like any other audio signal.

Several coding schemes are available for use with TTY. The most common is Baudot coding, which is supported as a default by all or almost all TTY termninals. The Baudot code is a half duplex code using characters made up of bits represented by designated frequencies, each bit being 22.0±0.4 msec long. A "1" (MARK) is represented by a frequency of 1400 Hz while a "0" (SPACE) is represented by a frequency of 1800 Hz. A transmitted character includes a start bit (0), five data bits, and one stop tone (1). The duration of the stop tone can be anywhere between a normal bit duration to two normal bits duration. If no other character is transmitted immediately after the current character, then the stop tone may be extended by a "MARK hold time" which may be anywhere from 0 to 300 msec.

The Baudot code supports two character sets, "letters" and "figures". Figures include numerals and punctuation marks. One character set or the other is selected by depressing or releasing a shift key on a teletype keyboard. There are six characters common to both sets. These are BCKSPACE (0), L.FEED (3), SPACE (4), C.RET (8), FIGURES (27) and LETTERS (31). FIGURES and LETTERS are used only to switch between the two character sets. In addition, five character values in the figures character set are undefined, so that the total number of distinct characters is 51.

TTY techniques are well developed in the context of conventional wire telephony. Wireless telephony presents at least two significant issues which must be addressed if TTY is to be successful. These are the distortion to the TTY signals caused by the wireless channel, and the provision of an interface between the cellular phone and a TTY termninal. These issues have been satisfactorily dealt with in the case of analog phones. A number of manufacturers offer TTY interface gear for use between the cellular phone handset and an RJ11 port of a teletype unit. In addition, distortion caused by analog wireless communication is generally acceptable for transmission of Baudot coded messages.

Digital wireless communication provides numerous advantages for voice communication. However, prior-art digital wireless communication has not proven to be well suited for TTY communication, because channel distortion in digital wireless systems is sufficiently great that practical TTY communication is prevented. There are two causes for this problem. In commonly used speech coders used in IS-136 (which employs time division multiple access, or TDMA), source coding distortion is introduced into the Baudot coding process. The speech coders in question are IS-641 and VSELP. The coders used in IS-136 have a bit rate of 8 kb/sec, in contrast to the US-1 coder used in GSM-NA (PCS 1900) or the QCELP13 coder of IS95 (which employs code division multiple access, or CDMA), which provide bit rates of 12–13 kb/sec, and do not produce the source coding distortion problem. The IS-136 coder is sufficiently widely used that it will continue to be encountered as part of the communications infrastructure, and therefore any TTY communications system must be able to deal with source code distortions produced by IS-136 systems.

Additionally, channel distortion in code division multiple access (CDMA) communications systems introduces frame errors. A frame error is detected through the use of cyclic redundancy code (CRC), and when a frame error is detected, the frame is ignored and the previous frame is essentially repeated with somewhat diminished spectral peaks and amplitude. A frame error is likely to cause an error in the FSK process, which in turn leads to a character error. Since the normal frame error rate in the CDMA network is approximately 2% and there are approximately 8–9 frames in one Baudot character, this leads to an unacceptable character error rate.

The Federal Communications Commission has instructed the wireless telephony industry to develop a solution for TTY over wireless networks. In industry discussions, three types of solutions have been offered. A long-term solution might replace the Baudot coding by a more robust data communication protocol. A medium-term solution might retain Baudot coding, but change speech or channel coding standards to reduce degradation due to source and channel distortion. A short term solution would be one which would not require any change to industry standards.

A short term solution, one which would not require changes to standards and accompanying changes to infrastructure, has distinct advantages of simplicity and speed of implementation. Such a system could be designed to be compatible with presently existing equipment, and could be implemented by any manufacturer who wished to produce the necessary components. There would be no need for coordinated activity among manufacturers, which might delay the introduction of equipment due to the need to reach agreements among manufacturers.

There exists, therefore, a need in the art for a wireless TTY system which overcomes source and channel distortion, which is compatible with existing TTY devices, and which does not require industry standards changes in order to communicate successfully with other devices.

SUMMARY OF THE INVENTION

In one aspect, removal of distortion in TTY signals is accomplished by a repeater according to the present invention. A repeater according to the present invention is implemented in a wireless telephone receiver. A speech decoder processes input signals coming into the telephone receiver and produces decoder signals comprising a series of data frames, commonly referred to in the art as speech frames. The speech frames may consist of voice data or Baudot code data, depending on whether voice or Baudot code data is being received. The repeater receives the speech frames from the speech decoder, and determines whether the speech frames represent voice or Baudot data. If the speech frames represent Baudot data, the repeater interprets the speech frame data and produces as output a clean version of the same data, removing any corruption which may have been introduced by channel or other distortion. The input to the repeater consists of the decoded speech frames and a frame error indicator from the speech decoder. The output consists of a signal with distortion removed, as well as a detection flag which indicates whether or not the signal is a TTY signal.

The repeater is conveniently viewed as a connected Baudot receiver and a transmitter. The transmitter operates in a conventional manner, while the Baudot receiver detects the Baudot signals and removes channel distortion. The performance of the repeater is measured by two parameters: the correctness and quality of the generated TTY signals and the accuracy of the detection flag. The accuracy of the detection flag determines the ability of the repeater to reject non-TTY signals. It is also possible to employ the Baudot receiver without the transmitter, simply using the receiver to interpret the signals and drive a display device or a computer.

A more complete understanding of the present invention, as well as further features and advantages of the invention, will be apparent from the following Detailed Description and the accompanying drawings.

BRIEF DESCRIPTION OF THE DRAWINGS

FIG. 2 illustrates operational steps performed by a repeater according to one aspect of the present invention;

FIG. 6 illustrates steps of decoding performed by a repeater according to the present invention;

FIG. 7 illustrates steps of updating of nodes performed by a repeater according to the present invention;

DETAILED DESCRIPTION

Figure 1A:
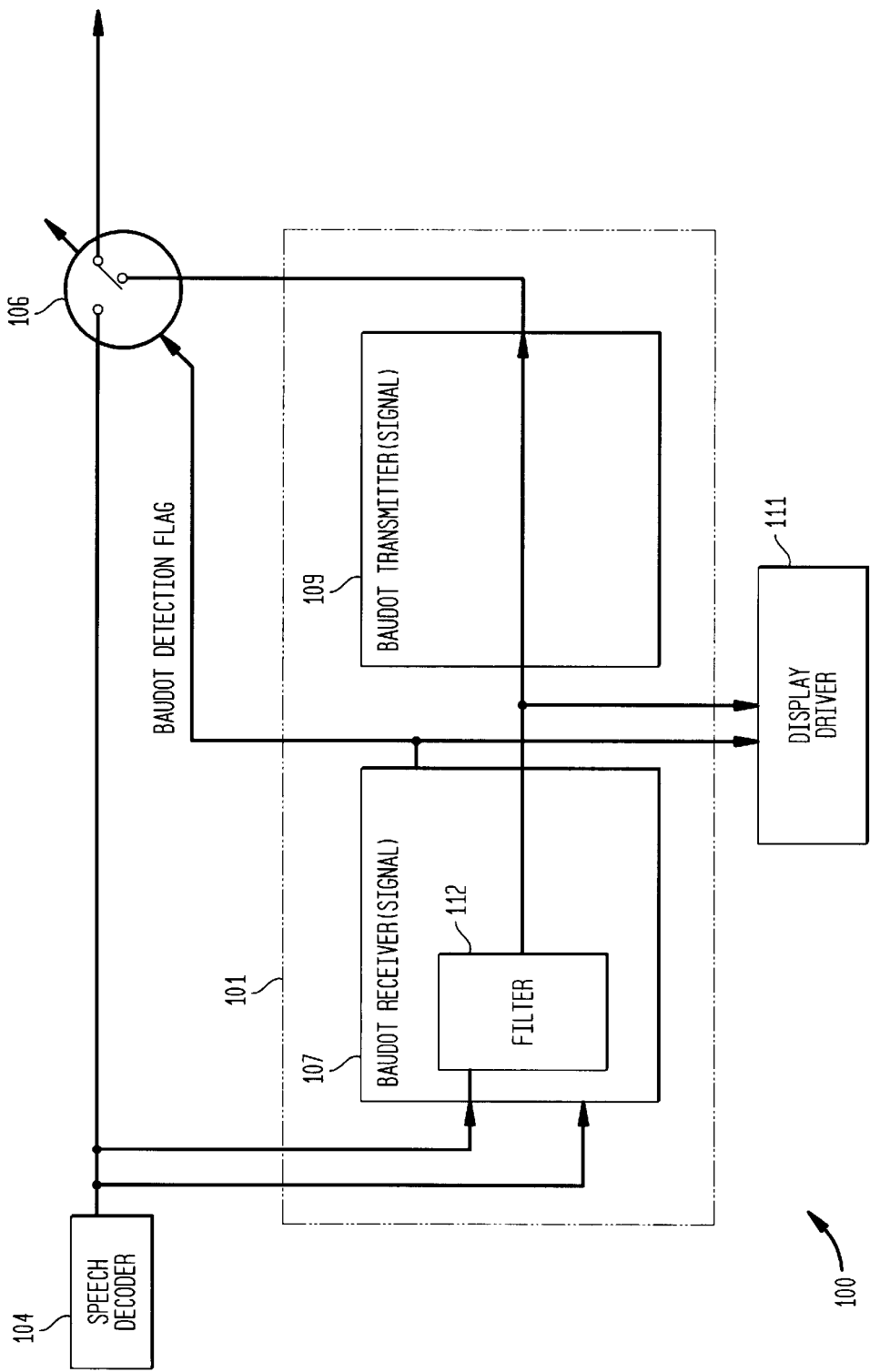
FIG. 1A illustrates a telephone receiver employing a repeater adapted to perform signal level operation according to the present invention.

FIG. 1A illustrates a wireless telephone receiver 100 including a Baudot repeater 101 according to one aspect of the present invention. The telephone receiver 100 also includes a speech decoder 104 which receives and decodes incoming signals to produce decoded speech frames. Typically, each frame comprises 160 samples at 8000 samples per second, or equivalently, 20 ms worth of speech. A Baudot bit contains 22 ms of speech. The speech decoder 104 passes each decoded speech frame to a switch 106, and to the Baudot repeater 101. The speech decoder 104 also passes a frame error flag to the repeater 101.

The repeater 101 includes a Baudot receiver 107 and a Baudot transmitter 109. The Baudot receiver 107 receives the decoded speech frames and the frame error flag as inputs. The repeater 101 processes each speech frame and passes it to the switch 106. The Baudot receiver 107 determines whether or not Baudot code is present in the speech frame and sets a Baudot detection flag accordingly. The Baudot receiver 107 passes the Baudot detection flag to the switch 106, to a Baudot transmitter 109, and to a display driver 111. The display driver 111 provides the ability to drive an external display which may be connected to the telephone receiver 100.

The action of the switch 106 is determined by the state of the Baudot detection flag received from the Baudot receiver 107. If the Baudot detection flag is not set, the switch 106 simply passes the output of the decoder 104 as the output of the telephone receiver 100. If the Baudot detection flag is set, the switch 106 passes the output of the Baudot repeater 101 as the output of the telephone receiver 100.

The repeater 101 is designed to operate at the signal level, which uses only spectral information about Baudot signals. It includes a filter 112 which passes the FSK signals (1400 and 1800 Hz) and stops other frequencies. It also stabilizes the amplitude and may also suitably be designed to stabilize the phase of the signal. The delay associated with this method of operation is very small, typically less than 1 msec. However, in this operational mode the receiver 107 cannot correct bad frames. Also, since rejection is based only on spectral content, there is a relatively high probability of false alarms.

In this mode, the output of the Baudot receiver 107 is used as the corrected signal. The Baudot receiver 107 also produces the Baudot detection flag based on the ratio between the energy output of the receiver 107 and the energy input to the Baudot receiver 107. The transmitter 109 is operated as a degenerate, unity system which passes the signals unchanged.

Figure 1B:
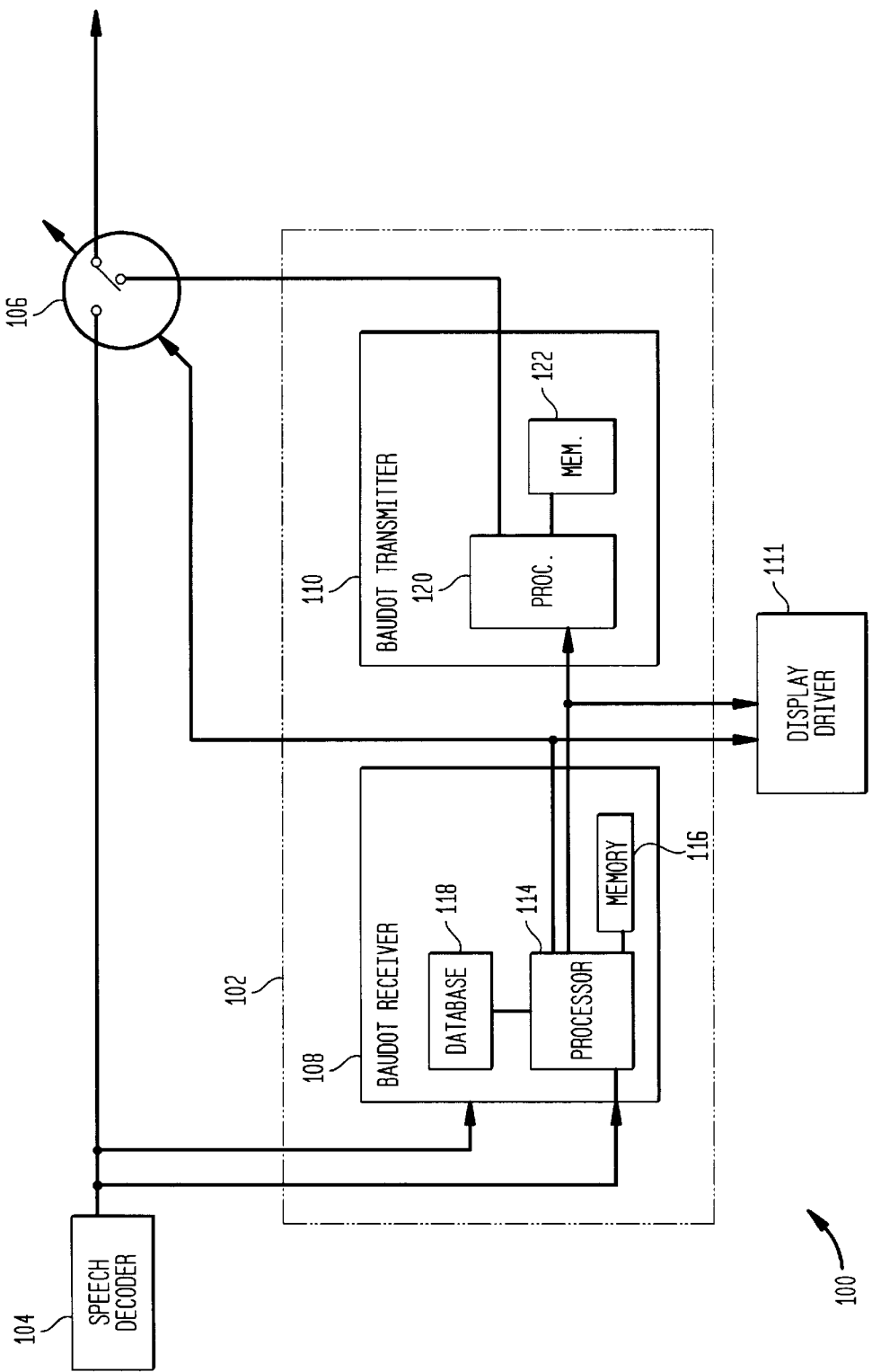
FIG. 1B illustrates a telephone receiver employing a repeater according to perform bit level or character level operation according to the present invention.

FIG. 1B illustrates a telephone receiver 100 with a repeater 102 substituted for the repeater 101 of FIG. 1A. The repeater 102 includes a Baudot receiver 108 and a transmitter 110. The repeater 102 can be designed to operate at the bit level or the character level. At the bit or character level, the repeater 102 interprets the signal produced by the decoder, in order to estimate the bits or characters represented by the signal. Details of the processing performed by the repeater 102 are described in greater detail in connection with FIGS. 2–9 below.

At the bit level, the Baudot receiver 108 estimates the bit streams corresponding to the signal. The Baudot receiver 108 includes a processor 114 and associated memory 116, as well as a database 118, in order to perform the necessary processing. As each bit or character is estimated, this information is passed to the transmitter 110, which generates the FSK tone corresponding to each bit. The transmitter 110 includes a processor 120 and associated memory 122 The decision about a bit identity and presence is made only at the end of the bit. Therefore, the repeater 102 can use spectral as well as durational information. However, since it is necessary to wait until the end of the bit, a delay of one bit, or 22 msec, is necessary. This method can handle single bad frames, since each bit spans more than a single frame. As noted above, a frame spans 20msec. Thus, either the beginning part or the ending part of the bit is present in a good frame, so that the repeater 100 can interpret bit information present in the frame before the bad frame and the frame after the bad frame, in order to identify the bit which was present in the bad frame. This level of detection is more accurate than signal level detection, since durational information is used as well.

At the character level, the Baudot receiver 108 estimates the character stream corresponding to the input signal, employing the processor 114, memory 116 and database 118. As each character is identified, this information is passed to the transmitter 110 and the transmitter 110 generates a Baudot signal corresponding to the character.

By estimating the bits or characters in the signal, the repeater 102 is able to produce a good signal, so long as the incoming data items, which are characters or bits depending on the operational mode for which the repeater 102 is designed. The signal received by the Baudot receiver 108 may be of a very poor quality, and may be difficult to interpret. However, if the signal can be interpreted at all, the Baudot receiver 108 simply directs the transmitter 110 to transmit a data item corresponding to that received. The data item generated by the transmitter 110 does not depend on the quality of the received data item, since the transmitter 110 generates the data item on its own, based simply on the data item identification, with no information about the quality of the data item being employed. It should also be noted that the receiver 108 can be used without the transmitter 110. In that case, the Baudot receiver 108 simply interprets the signal to determine the characters represented by the signal, and supplies them to a display, for example by using the display driver 111. The display driver 111 may conveniently be designed to provide flexibility in display options. For example, in cases where a character is ambiguously identified, the display driver 111 may highlight the dubious character, or may simultaneously display alternative characters.

The cost of using character level operation is a delay which is greater than that experienced in signal level or bit level operation. Since the decision about a character is made only at the end of the character, there is a delay of one character (up to 176 msec). However, the use of character level operation provides significant advantages for error correction. In this mode, further corrections are possible. For example, it is possible to learn the duration of the stop bit transmitted by a TTY with which communication is being conducted. This information allows correction of a run of two bad frames if they occur during the start or stop bits. If one bit cannot be recovered, a choice can be made between two possible characters. The choice can be made based on their relative frequency in the language, or alternatively may be based on the conditional probability of encountering each of these characters after the previous character, provided that the previous character was correctly recognized. This information can be programmed into the processor 114, or may be stored in memory 116.

The primary effect of the delay of each of the above three modes is on transitions between TTY and normal speech. When a call is established, the default expectation is that operation will proceed in voice mode. The telephone receiver 100 should operate in TTY mode only when TTY signaling is detected. In the bit or character mode, delay is significant and switching between TTY and voice mode in the middle of a character would create an error. It is therefore necessary to wait until the end of the character before setting the switch 106 to pass the output of the repeater 102 as the output of the telephone receiver 100. After switching, it is necessary to transmit silence for the duration of the delay experienced by the repeater 102 and transmit the output of the repeater 102 only after the end of the delay.

If TTY signaling is stopped and voice communication begins, the TTY detection flag should be cleared and the receiver 100 should immediately switch to using the output of the speech decoder 104 as output, instead of using the output of the repeater 102. During that switch, a voice segment lasting as long as the duration of the delay will be lost.

During TTY communication, a delay of one character does not greatly impair communication. Similarly, the loss of less than 200 msec of speech which would occur in switching from TTY to speech is typically insignificant because it is unlikely that the user will begin talking within 200 msec after typing the last character in a TTY transmission. In view of this, it is preferable to design the repeater 102 to operate at the character level, due to the advantages of character level operation compared to the slight or insignificant disadvantages of the longer delay required.

TTY reduces the number of keys needed in a terminal by providing a shift key to select one of two character sets. Pressing the shift button on the TTY keyboard causes transmission of the "figures" control characters and releasing it causes transmission of the "letters" control characters. Upon receiving those characters, the receiving terminal, such as the telephone receiver 100, should switch to the appropriate character set. Errors in these control characters cause particular difficulties because they cause a run-on sequence of errors in subsequent characters. In some cases, a shift error can be detected by the receiver at a delay of several characters by recognizing that if a "letters" control character is received while the system is already in "letters" mode, or a "figures" control character is received while the system is in "figures" mode, it is clear that either this character is wrong or the previous shift character was wrong. On the other hand, if the Baudot receiver 108 is in "figures" mode and bit patterns of non-existing characters are repeatedly received, the receiver 108 should likely be in "letters" mode.

Once a shift error is detected, the processor 114 may determine where the error occurred, whether in the current character or in some previous character. If the error occurred in a previous character it may be possible to correct the run-on error by directing the transmitter 110 to transmit BCKSPACE characters to delete the run-on errors, transmit the correct shift control character and then transmit the deleted characters again. Humans do not type at a sustained rate of nearly 5 to 6 characters per second, so the telephone receiver 100 will be able to perform the transmission necessary to correct the error, and will also be able to transmit characters as they are typed.

FIG. 2 is a flowchart illustrating the operation of a repeater according to the present invention, such as the repeater 102, in a wireless digital telephone receiver. The repeater processes a decoder signal received from a voice decoder, the decoder signal comprising a series of speech frames which include Baudot signals. The repeater provides an output with reduced or eliminated distortion. At step 201, the repeater is initialized and prepared to receive the input signal. At any instance during operation of the repeater, the input signal may be in one of four states:

1—a bit of "1" (MARK)
0—a bit of "0" (SPACE)
V—Voice
Q—Quiet

Each of these states is associated with a particular probability of the instantaneous spectral content and amplitude of the signal. At initialization, the input signal is assumed to be in the Quiet state, and the repeater is set accordingly. In addition, observation points are established which will provide for successful interpretation of the input signal, taking into account the need to minimize the impact of bad frames. Next, at step 202, the repeater receives the input signal, as processed by a decoder such as the decoder 104. The input signal as presented to the receiver comprises a series of speech frames. Next, at step 204, the first observation point is selected for observation. Next, at step 206, the repeater computes a distortion measure based on the instantaneous properties of the input signal, taking into account the state of the input signal. The computation is preferably performed by a receiver such as the Baudot receiver 108. The distortion measure expresses the deviation of the properties of the observed signal from those expected at that state. At step 208, the distortion measure is fed into a trellis structure. At step 210, a modified Viterbi algorithm is used to decode the information received from the observation point. If the decoding reveals that the decoder output is in the Voice state, the process proceeds to step 212 and a Baudot detection flag is cleared to indicate that the decoder output is to be passed unchanged as the output of the telephone receiver. Next, if the call has finished, the process terminates at step 250. If the call has not finished, the process proceeds to step 214 and the next observation point is selected. Next, the process returns to step 206. If the decoder output is not in the Voice state, the process proceeds to step 216 and if sufficient observation points have been processed to identify a data item, the data item is identified. Next, the process continues to step 218 and if a data item has been identified at step 216, a data item is generated corresponding to the data item identified. The generation of the data item is performed by a transmitter such as the transmitter 110, based on instructions from a receiver such as the receiver 108. If the call has finished, the process terminates at step 250. If the call has not finished, the process proceeds to step 214, the next observation point is selected and the process returns to step 206.

Turning now to a more detailed analysis of the selection of observation points at step 201 above, the following requirements must be taken into account. In order to make a proper comparison between distortion values of the received signals and expected distortion signals of the Baudot code values, it is important to choose observation times properly. A factor in this choice is the choice of a proper interval between observations and bad frames. A time point at which distortion measures are computed is called an observation point, the interval between consecutive observation points is an observation interval and the set of all observation points is the observation grid. In principle, it is possible to have an observation point at each sample. However, this could require excessive computational resources. On the other hand, computing distortion measures once every 2 msec (16 samples) should be sufficient, since it should provide 10 to 12 observation points during a Baudot bit period and should therefore provide fairly good durational resolution. However, this approach presents one potential problem in particular. If a bad frame occurs in such a way that it covers most of the bit interval, there may be very few reliable measurements upon which to base the interpretation of the received signal. In order to alleviate this problem, two measures are taken.

The duration of an observation interval should divide the speech frame duration, and the observation grid should be placed so that the last sample in each frame is an observation point. This will guarantee that in the frame preceding a bad frame, samples will be received which are as close as possible to the beginning of the bad frame and in the frame following a bad frame the samples will be as far away as possible from the beginning, thus increasing their reliability. This is because the unreliability of the signal following a bad frame is estimated by a factor $2^\delta$ and the value of $\delta$ decreases linearly to zero following a bad frame. The farther past the bad frame the sample is taken, the lower the value of $\delta$ will be, and thus the lower the unreliability of the signal will be.

An alternative way to handle this problem also exists. In this alternative, during a fixed time segment before a bad frame the observation interval should be decreased by an integer factor (for example, 0.5 msec instead of 2 msec) thus increasing the amount of information gathered about the bit which continues into the bad frame. This requires a delay of one frame in processing, since it is necessary to wait for the next frame in order to determine if it is bad or not. This delay is absorbed in the delay of the bit level or character level receiver.

A similar approach is preferably taken with a time segment after the bad frame. However here the fixed time segment should be much longer because the purpose of the finer grid is simply to provide more information about a bit which potentially is mostly covered by the bad frame. In the frame following a bad frame all observation points are less reliable, in particular those near the bad frame. Therefore a higher observation rate is a way to compensate for a higher "observation noise".

Turning now to step 204, the following equations and techniques are performed for computation of the distortion measure for the observation point under examination. Let $\{x[n]\}$ be the samples of the input signal and let $\{S[n]\}$ be the corresponding unknown state at time n. $y_s[n]$ is the linear prediction residual for the state s at time n. For each state s $\in \{0, 1, V, Q\}$ let $$y_s[n] = x[n] + a_s[1]x[n-1] + a_s[2]x[n-2] \tag{1}$$

Where $a_s[1]$ and $a_s[2]$ are the state specific parameters that minimize $E\{y[n]^2|S[n]=s\}$ (the expectation of $y[n]^2$ given that $S[n]$ is in state s.) That is, $a_s[1]$ and $a_s[2]$ are the second order linear prediction coefficients for each state s in the mean square sense. The distortion measure in each state s will be defined as the minus log likelihood of $y_s[n]$ plus a state specific offset, $\beta_S$.

In order to compute the likelihood of $y_s[n]$, it is assumed that $y_s[n]$ are values of independent, zero mean, Gaussian or Laplacian random variables with state dependent variance $\sigma_s^2$. It is also assumed that the standard deviation of $y_s[n]$ at each state s is proportional to the current amplitude envelope $A[n]$ of the input signal. Therefore:

$$\sigma_s = A[n] * \gamma_s[n] \text{ for } s \in \{0, 1, V, Q\} \text{ at each time point } n \qquad (2)$$

$\{\gamma_0, \gamma_1, \gamma_V, \gamma_S\}$ are the normalized state dependent standard deviations.

For Gaussian distribution, the distortion at state $\epsilon\{0, 1, V, Q\}$ is given by:

$$\begin{aligned} d_{Gs}(y_S[n]) &= \log(2\pi) + \log(\sigma_S) + y_S[n]^2/2\sigma_S^2 \\ &= \log(2\pi) + \log(\gamma_S) + \log(A[n]) + (y_S[n]/A[n])^2/2\gamma_S^2 \\ &= \underline{\beta_S} + \log(A[n]) + (y_S[n]/A[n])^2/\gamma_S^2 \end{aligned} \qquad (3a)$$

where $\beta S$ is the sum of all constant terms, or $\log(2\pi)+\log(\gamma_S)$. Similarly, the Laplacian distribution is given by:

$$\begin{aligned} d_{Gs}(y_S[n]) &= \log(2) + \log(\sigma_S) + |y_S[n]|/\sigma_S \\ &= \log(2) + \log(\gamma_S) + \log(A[n]) + (y_S[n]/A[n])^2/\gamma_S \\ &= \underline{\beta_S} + \log(A[n]) + (y_S[n]/A[n])/\gamma_S \end{aligned} \qquad (3b)$$

The estimation of the envelope amplitude $A[n]$ is discussed below. Also discussed below are the computation of the linear prediction coefficients for each state, and thus the computation of $y[n]$. The parameters $\{\gamma_0, \gamma_1, \gamma_V, \gamma_S\}$ may be established by estimating the variance of $y_s[n]/A[n]$ for each state in a labeled database (i.e. a database including Baudot signals and speech in which the state of each frame is known).

The parameters $\{\beta_0, \beta_1, \beta_V, \beta_S\}$ should also be estimated using a labeled database. Their values should be set so that the classification error among the four states, based on the distortion measures, will be minimal.

During bad frames, special handling is required. During a bad frame, the output of a decoder such as the decoder 104 is totally unreliable. Thus, during a bad frame the distortion measures are not computed at all. For convenience, the distortion measures may simply be set to zero. Alternatively, it is possible to increase all standard deviations by a factor $2^\delta$ where $\delta=\delta_{bad}$ is a relatively large number, for example $\delta=10$. Note that increasing the standard deviation by $2^\delta$ requires also increasing each of $\{\gamma_0, \gamma_1, \gamma_V, \gamma_S\}$ by $\delta$. However, since the effect is identical for all states this addition may be ignored.

During some frames which immediately follow a bad frame, the reliability of the output is also degraded, because typically a speech coder uses information about previous frames in order to decode the current frame. However, the effect of a bad frame diminishes as the transmission continues beyond the bad frame. Therefore, during a specific time segment following a bad frame, a factor $2^\delta$ is used, where $\delta$ decreases linearly during the segment from its value during the bad frame, and has a terminal value of 0.

Figure 3:
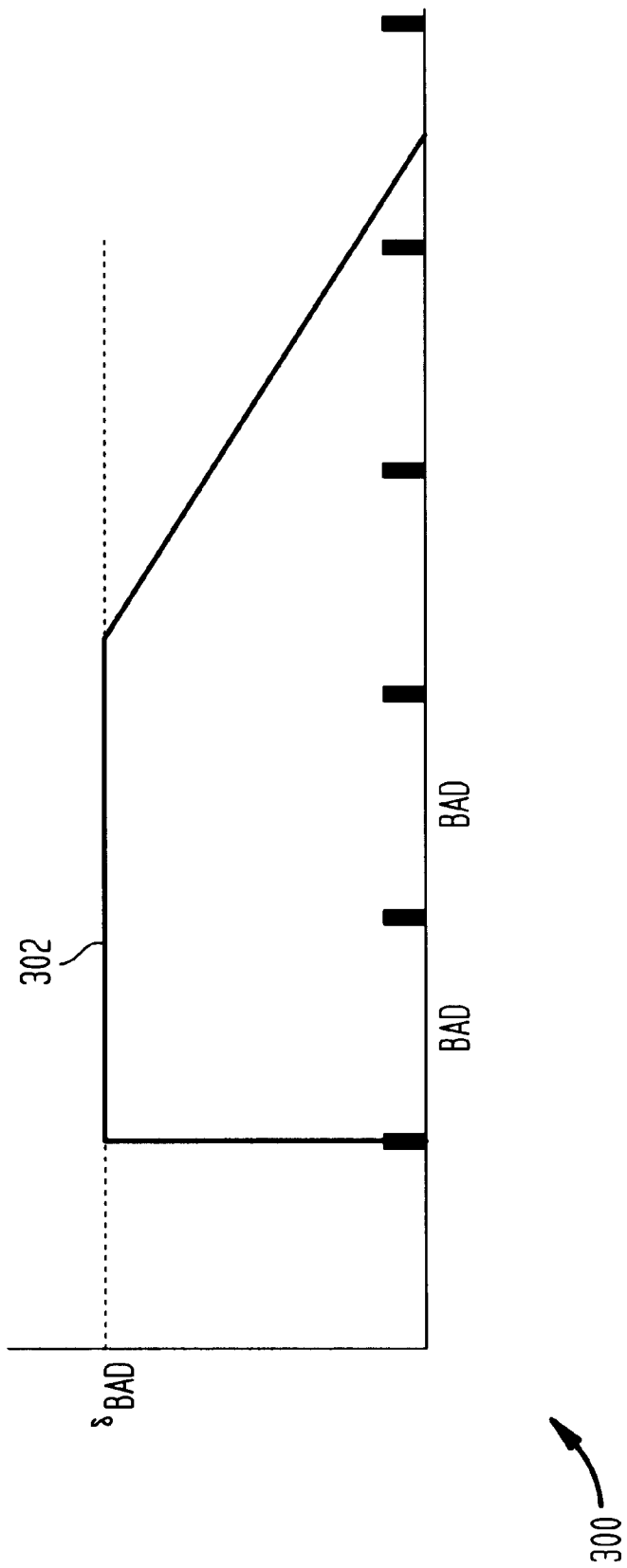
FIG. 3 is a graph illustrating change over time of a value δ on which a distortion factor during and after a bad frame is dependent.

FIG. 3 is a graph 300 illustrating the behavior of $\delta$ in during and around a bad frame. The curve 302 shows that $\delta$ has a value of $\delta_{bad}$ during the bad frame, and decreases linearly to 0 over the subsequent 2.5 frames.

The envelope amplitude $A[n]$ is estimated recursively each time the distortion measures are computed. In the following, the time index $[n]$ is omitted for brevity; however, it should be clear that $A[n]$ is the most recently updated value of A. It is reasonable to assume that the level of $\gamma_S[n]$ is proportional to the level of $x[n]$. The level of the amplitude A is initialized to $A_{min}$ where $A_{min}$ is the minimum level of the envelope that can be reasonably expected during speech or Baudot signaling. Afterwards, each time the distortion levels are computed, prior to their computation the amplitude A is updated using an attack-decay filter as follows: Let $A_{old}$ be the previous estimate of A. Then the new estimate at time n, $A_{new}$, is given by:

$$A_{new} = \text{Max}\{A_{min}, A_{old} + \alpha(|x[n]| - A_{old})\} \qquad (4)$$

where $\alpha = \alpha_{attack} = 1$ when $|x[n]| \geq A_{old}$ and otherwise $\alpha = \alpha_{decay} = \min\{1, \Delta T/\tau\}$, $\qquad (5)$ and where $\Delta T$ is the time elapsed since the last update and $\tau$ is a time constant of the decay. $\tau$ may conveniently be selected to be the average time duration between typed characters.

In order to perform interpretation of the received signal, it is necessary to know expected values for the distortion measure of each Baudot code state. During states 0 and 1 the signal is assumed to be a sine wave of amplitude A. Let $f_N$ be the Nyquist frequency $f_N=4000$ Hz) and let $\omega_0=\pi 1800/f_N$ and $\omega_1=\pi 1400/f_N$ be the angular frequencies corresponding to states 0 and 1 respectively. Sine waves of frequency $\omega_S$ and arbitrary phase and amplitude satisfy, and are the only solution of, the equation:

$$x[n] - 2 \cos \omega_S x[n-1] + x[n-2] = 0 \qquad (6)$$

Thus for states $s \in \{0,1\}$, $a_s[1] = -2 \cos \omega_S$, $a_s[2] = 1$ and therefore $$y_s[n] = x[n] - 2 \cos \cos \omega_S x[n-1] + x[n-2] \qquad (7)$$

During the "quiet" state, it can be assumed that input signals consist of background noise. The simplifying assumption can be made that this noise is white and therefore $y_Q[n] = x[n]$ and $a_Q[1] = a_Q[2] = 0$. The whiteness assumption may not be accurate, but does not impair the operation of a repeater according to the present invention.

For the voice state, it is necessary to compute the long term second order linear prediction coefficients from a speech database. This can be done by computing the autocorrelations of orders 0,1,2 over all speech segments in the data and then using the Durbin algorithm to compute $a_V[1]$, $a_V[2]$.

The expected distortion values for the states 0, 1, Q and V are compared against the computed distortion values for each of the received signals, as detailed further below.

Figure 4:
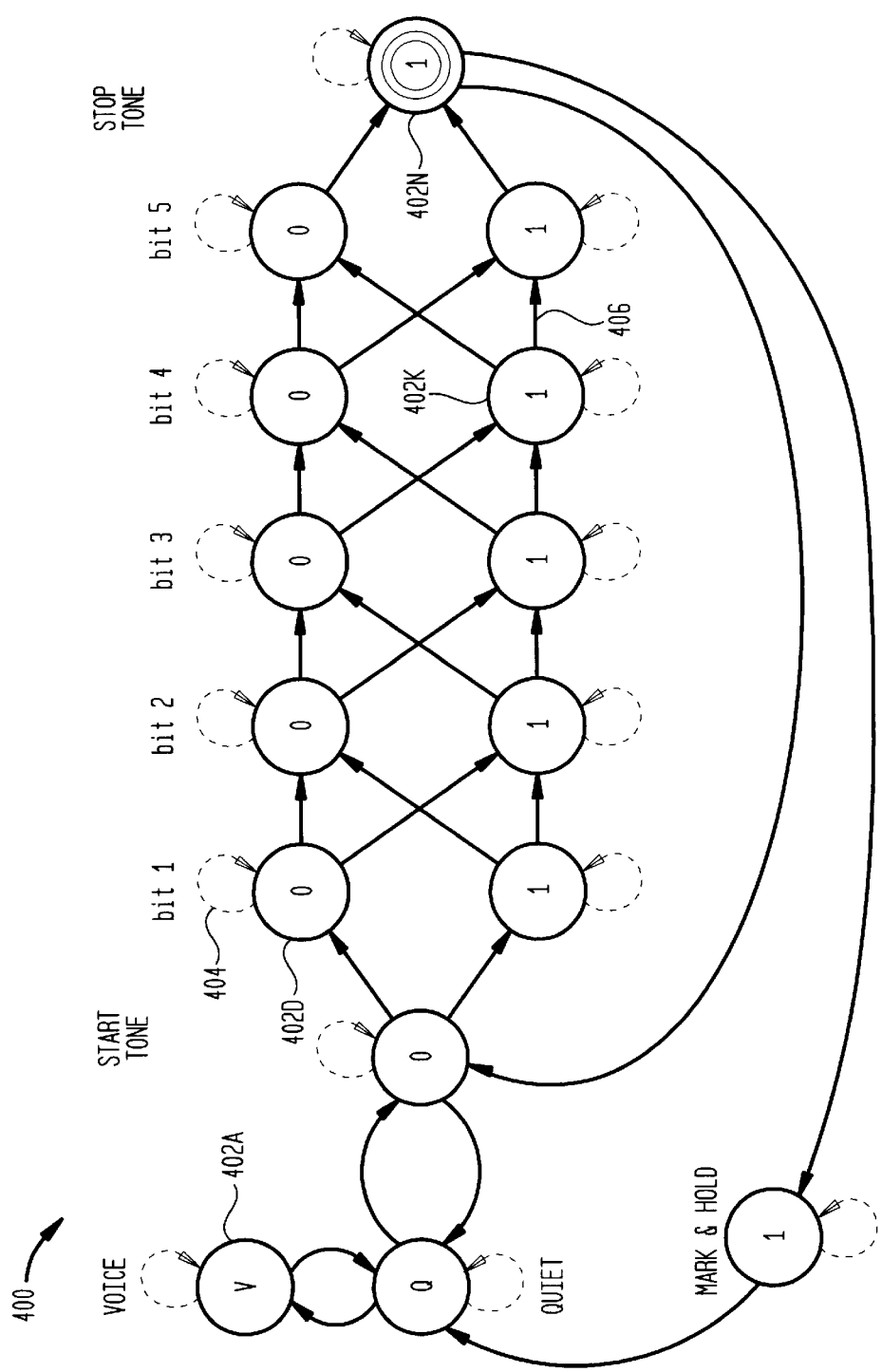
FIG. 4 illustrates a trellis structure suitable for character level detection by a repeater according to the present invention.
Figure 5:
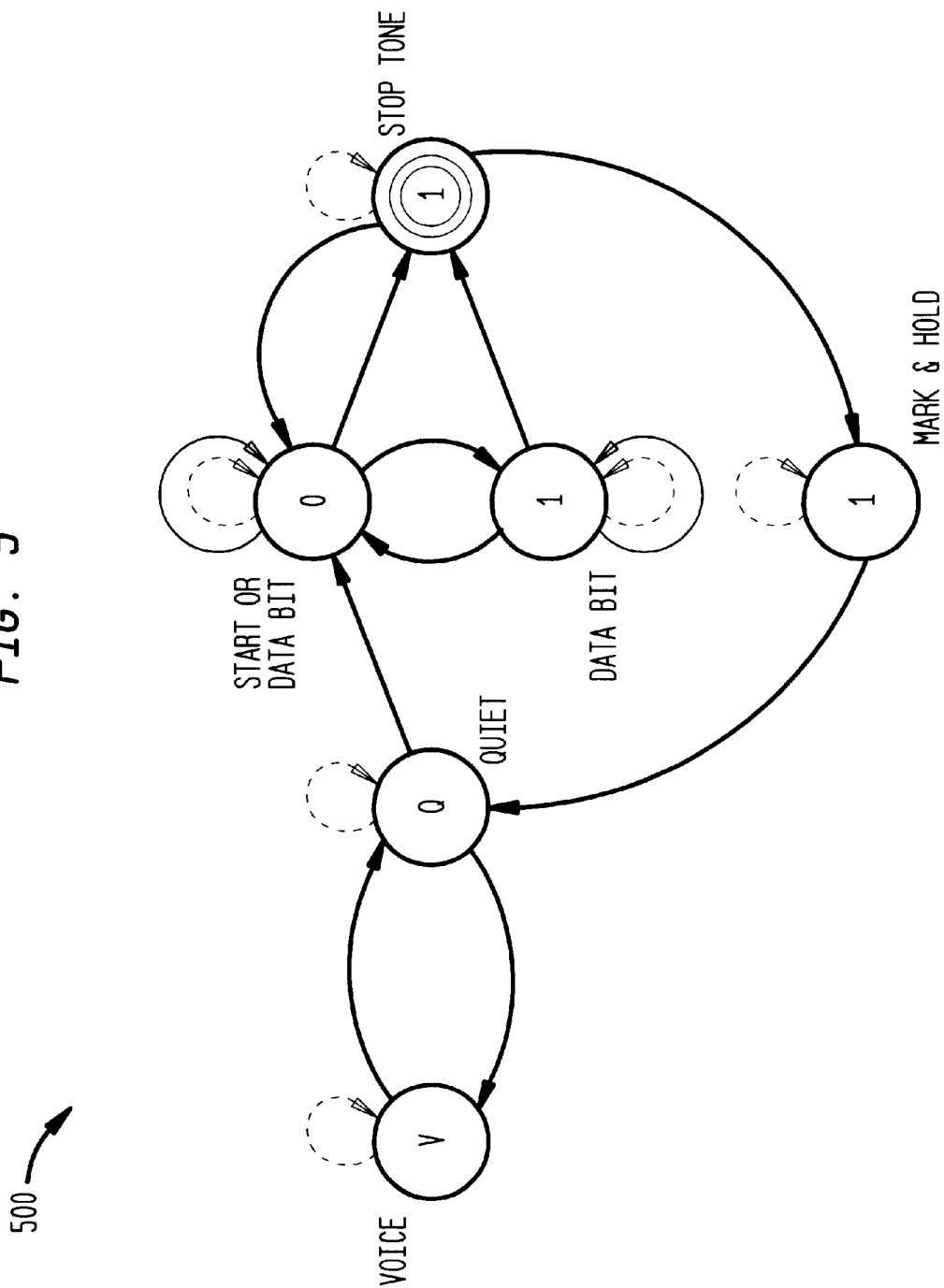
FIG. 5 illustrates a trellis structure suitable for bit level detection by a repeater according to the present invention.

Turning now to further details of step 206, a trellis structure is used to impose temporal and "syntactical" constraints on the observed signal. Exemplary trellis structures which may be used are shown at FIGS. 4 and 5. FIG. 4 illustrates an exemplary trellis structure 400 suitable for character level detection. It will be recognized, however, that other similar trellis structures may also be considered.

The trellis structure 400 is a directional graph comprising a plurality of nodes 402A . . . 402N. Each of the nodes 402A–402N represents one of the four acoustic states $\{0, 1, V, Q\}$ at which the signal can be at any given observation point. There may be more than one node for the 0 and 1 states in order to account for the structural (or "syntactical") constraints of the Baudot character. The allowed transitions among the nodes are designated by arcs. For the sake of simplicity, not every node or arc is labeled, but the nodes and arcs which are labeled and specifically discussed are comparable to the remaining nodes and arcs. Two types of arcs, of which representative examples are arcs 404 and 406, are shown in the figure. Dashed line arcs, such as the arc 404, indicate self transition within the same bit duration. Solid line arcs, such as the arc 406, indicate transition from one bit to the next bit. Thus data bit nodes have self transition arcs of both types. Although both types of arcs have the same source and destination nodes, each of them has a different meaning: a transition over the dashed line arc means staying within the same bit while a transition over the solid line arc means a transition to the next bit, which happens to have the same logical value as the current one. The trellis of FIG. 4 represents the complete structural constraints of Baudot transmission. Thus, any path through the graph that begins and ends in the node of state Q and does not pass through a node of state V represents a sequence of legal Baudot characters, each of which begins at the start bit node and ends at the stop tone node.

FIG. 5 illustrates a simpler trellis 500 suitable for bit level detection. The trellis 500 of FIG. 5 represents most of the constraints, but does not include the constraints that a character must include exactly 5 data bits. Therefore, a path through the trellis 500 that begins and ends in Q and does not pass through V does not necessarily represent a sequence of legal Baudot characters. Moreover, in the trellis structure 500 a path may be constructed which represents a sequence of legal Baudot characters, but which does not include the stop tone node as the last node in each character. Therefore, the trellis structure 500 of FIG. 5 is not suitable for character level detection. It is, however, suitable for bit level detection.

In both FIGS. 4 and 5, the following conventions are employed. The circle representing each node is drawn differently according to the temporal constraints on this node. A circle drawn with a thin line represents a node not subject to any temporal constraints. The signal can be in this node for any duration of time. A circle drawn with a thick line represents a node for which the signal can stay in this node exactly one Baudot bit. Since there may be some variation in the bit duration and since the resolution of the observation grid introduces more temporal uncertainty, these states are characterized by minimum and maximum constraints on the stay time. A circle drawn with a triple line represents a node in which the signal can stay for the duration of the Baudot stop bit. That is, the signal can stay in such a node for a duration of between 22 and 44 msec.

The "MARK and hold" state is drawn in these figures as if it has no temporal constraints. mIn fact it is also subject to some temporal constraints, but they are so loose (not longer than 300 msec) that they may suitably be ignored.

Turning now to further details of step 208, a modified Viterbi decoding process is used at step 208 of FIG. 2, in order to determine the received data item. Viterbi decoding is typically used in order to estimate a bit or character sequence using a trellis structure. A repeater according to the present invention employs a modified version of this method. The modification is the addition of temporal constraints to the duration of stay in some of the states.

Each node in the trellis structure is associated with a set of variables called the node variables. At each observation point, the node variables are updated and checked to determine if a detection result is available. The node variables are score, duration, trace and ambiguity. The score of a node at any given observation point represents the likelihood that the optimal path through the trellis will be at that observation point in this node. The lower the score, the more likely this hypothesis is. Duration represents the time spent in this node since entering it via a solid line arc. In the nomenclature used above to describe the trellis graphs, the observation interval corresponding to the transition arc belongs to the duration of the source node, not the destination node. Trace represents the sequence of bits that have been completed before entering this node. Typically the trace can be represented by two bytes, one indicating how many bits have been completed and the other byte contains the bit sequence. Ambiguity is represented by ambiguity flags. Ambiguity flags are a sequence of flags that correspond to the bit sequence of the trace. If an ambiguity flag is set, this flag indicates that the detection the corresponding trace bit is not reliable. One byte is sufficient to hold the ambiguity flags of one node.

FIG. 6 illustrates in greater detail the decoding process of step 208 of FIG. 2. At step 602, the node variables of each node are updated. This is discussed below in greater detail in connection with FIG. 7. At step 604, detection is attempted. This is discussed below in greater detail in connection with FIG. 8.

FIG. 7 illustrates in greater detail the steps performed in updating the nodes, as discussed in connection with step 602 of FIG. 6. At step 702, for each arc, a determination is made as to whether a transition along that arc is allowed. This determination is made by computing the sum of the source node duration and the observation duration. For a dashed line arc, a transition is allowed if that sum does not exceed the node's maximum duration constraint. For a solid line arc, a transition is allowed if the sum is between the minimum and the maximum duration constraints of that node. Note that the temporal constraints depend on the type of node, as explained above. At step 704, arc variables are assigned to each arc. The arc variables for each arc are the node variables of its source node, with the following modifications. If a transition along that arc is not allowed, the score of the arc is set to infinity. If a transition is allowed and the arc is a dashed line arc, the duration of the last observation interval is added to the duration. If a transition is allowed and the arc is a solid line arc, the duration is set equal to zero interval and if the source node is of state 0 or 1, and it is not the "MARK & hold" node, that state is added as the highest, that is, the latest, bit to the trace.

At step 706, the first node is selected. Next, at step 708, a search is made over all arcs which have the node as a destination node, and the arc with the minimum score is selected. The arc variables are copied into the node variables. If the selected arc is a solid line arc and there is another solid line arc leading to the same destination node with a similar score, that is, if the difference between the scores of the two arcs is less than a preset threshold, the traces of the two arcs are compared and the ambiguity flag is set for each trace bit which is different between the two arcs. At step 710, the distortion measure of the state of the node is added to the score of the node. At step 712, a determination is made as to whether the last node has been updated. If the last node has not been updated, the process continues at step 714, the next node is selected and the process returns to step 708. If the last node has been updated, the process finishes at step 716 and the node with the minimum score is found and the minimum score is subtracted from the scores of all nodes.

Figure 8:
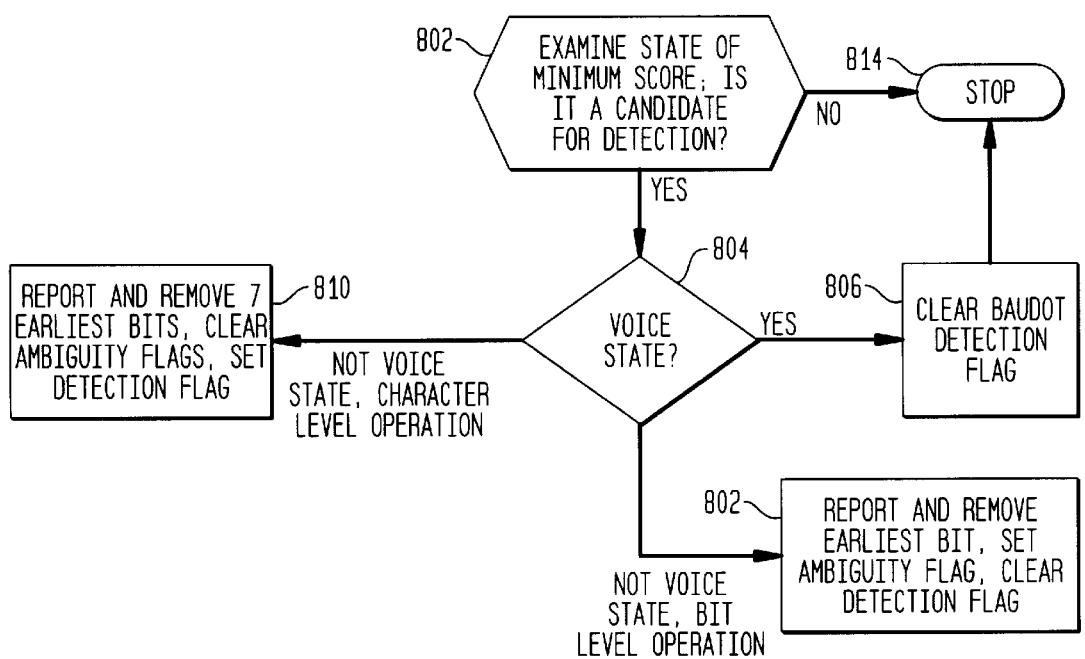
FIG. 8 illustrates steps of data detection and interpretation performed by a repeater according to the present invention.

FIG. 8 illustrates in additional detail the detection step 604 of FIG. 6. The purpose of the detection is to report results as they become available. Typically, there is a delay of T bits between the termination of a bit or tone and the corresponding report. T is called the detection delay, and is the minimum duration in bits of a state which is eligible to be a candidate for detection, unless the state is the voice (V) state. For character level detection, the delay T has to be at least 7 bits (one character). For bit level detection, T may be smaller, but it may also be equivalent to one character or more. At step 802, the state of minimum score is examined to determine if it is a candidate for detection. Detection is performed after updating if the following conditions are satisfied: the state of minimum score has duration zero, that is, it has just been entered by a solid line arc. That state is called the detection state. In addition, the detection state must be either the voice (V) state, or alternatively the trace of the detection state must include at least T bits, where T is the detection delay. If these conditions are not met, the process terminates at step 814. If the conditions are met, the process continues to step 804. At step 804, the detection state is examined to determine if it is the voice (V) state. If the detection state is the voice state, the process continues to step 806 and the Baudot detection flag is cleared. The process then terminates at step 814. If the detection state is not the voice state, the next step of the process depends on whether operation is occurring on the bit level or the character level. If operation is occurring on the bit level, the process continues to step 808 and the earliest bit in the trace is reported and removed from the trace, the ambiguity flag corresponding to the bit is cleared, and the Baudot detection flag is set. If operation is occurring on the character level, the process continues to step 810, the earliest 7 bits in the trace (that is, the earliest character in the trace) are reported and removed from the trace, the ambiguity flags corresponding to the 7 earliest bits are cleared, and the Baudot detection flag is set.

The trellis processing described above in connection with FIGS. 2–8 extracts two types of information from a signal. This is (1) the framing informnation, which includes the beginning and ending times of each bit, and, for character level detection, also the beginning and ending times of each character, and (2) the classification information, which specifies the contents of each bit. It is clear that correct framing is essential for successful detection. An error in framing can create a run-on of bit errors over several bits or even several characters, until correct framing information is restored.

The framing information is obtained from the transition between 0, 1 and Q states. Unlike more modem coding methods such as Manchester code, Baudot coding does not guarantee a transition in every bit. Baudot coding only guarantees two such transitions per character, which comprise a transition from S or 1 to 0 in the beginning of the character and transition from 0 to 1 somewhere within the character. Additional transitions are possible but not guaranteed. Thus, if one or both of these transitions occur within a bad frame, there is a serious risk of framing error or loss of synchronization. The problem may become more serious because framing information cannot be easily carried from one character to the next. This is because the duration of the stop tone is variable and characters may be spaced by a variable duration of silence. Several possible enhancements may be applied to the trellis processing described above, in order to improve the reliability of framing in the presence of bad frames.

One enhancement which may advantageously be used is the estimation of the stop tone duration. If characters are transmitted contiguously, that is, without "Q" intervals in between, then framing information could be carried from one character to the other if the exact duration of the stop tone were known. Since in many cases the duration of the stop tone is not a whole multiple of the bit duration (nominal duration is about 1.5 bits) this information can be used to restore character framing information as well. Although there may be a significant variability in the duration of the stop tone among TTY's, it should be very similar or nearly identical for the same TTY. Thus during a call, the mean and variance of the durations of the identified stop tones may be estimated and continuously updated. This statistical information may be used for setting tighter temporal constraints on the stop-tone node.

A second possible enhancement is the relaxation of the temporal constraints around bad frames. If a bit starts, that is, if a node is entered in the trellis during a bad frame, then the normal constraints on the duration of that bit should be relaxed by the uncertainty about the duration of stay in the previous node. Assuming that the observation interval is significantly longer than the variability allowed by the standard for the bit duration, for example, 0.4 msec, then the uncertainty about a normal bit duration is one observation interval. The increase in variability depends then on the preceding bit. If the preceding bit is also a normal bit, then the uncertainty grows to a duration of two bits. If the current bit is a start bit preceded by silence "Q" then the bit could begin anywhere within the frame, and thus the uncertainty is 20 msec. If the current bit is a start bit preceded by a stop tone, then initially the uncertainty depends on the duration t of the observed part of the stop tone. Since the duration of the stop tone is 22 to 44 msec, the additional uncertainty is 44-Max(22,t). If a tighter range has been obtained about the duration of the stop bit, then the additional uncertainty can be corrected accordingly.

Therefore, whenever a transition is made over a solid line arc during a bad frame, the duration constraints of the destination node may suitably be relaxed by combining the uncertainty of the previous node duration with that of the current duration.

An additional enhancement is to embed temporal constraints into the trellis itself. The basic idea behind using a trellis structure is that Viterbi decoding, being based on dynamic programming, finds an optimal path through the trellis structure. This principle of dynamic programming can guarantee optimality if the following condition holds: if a path through the trellis is the optimal path to a given node A, at time t, then any sub-path of that path, that ends in node B at time s (s<t), is an optimal path to node B at time s.

Figure 9:
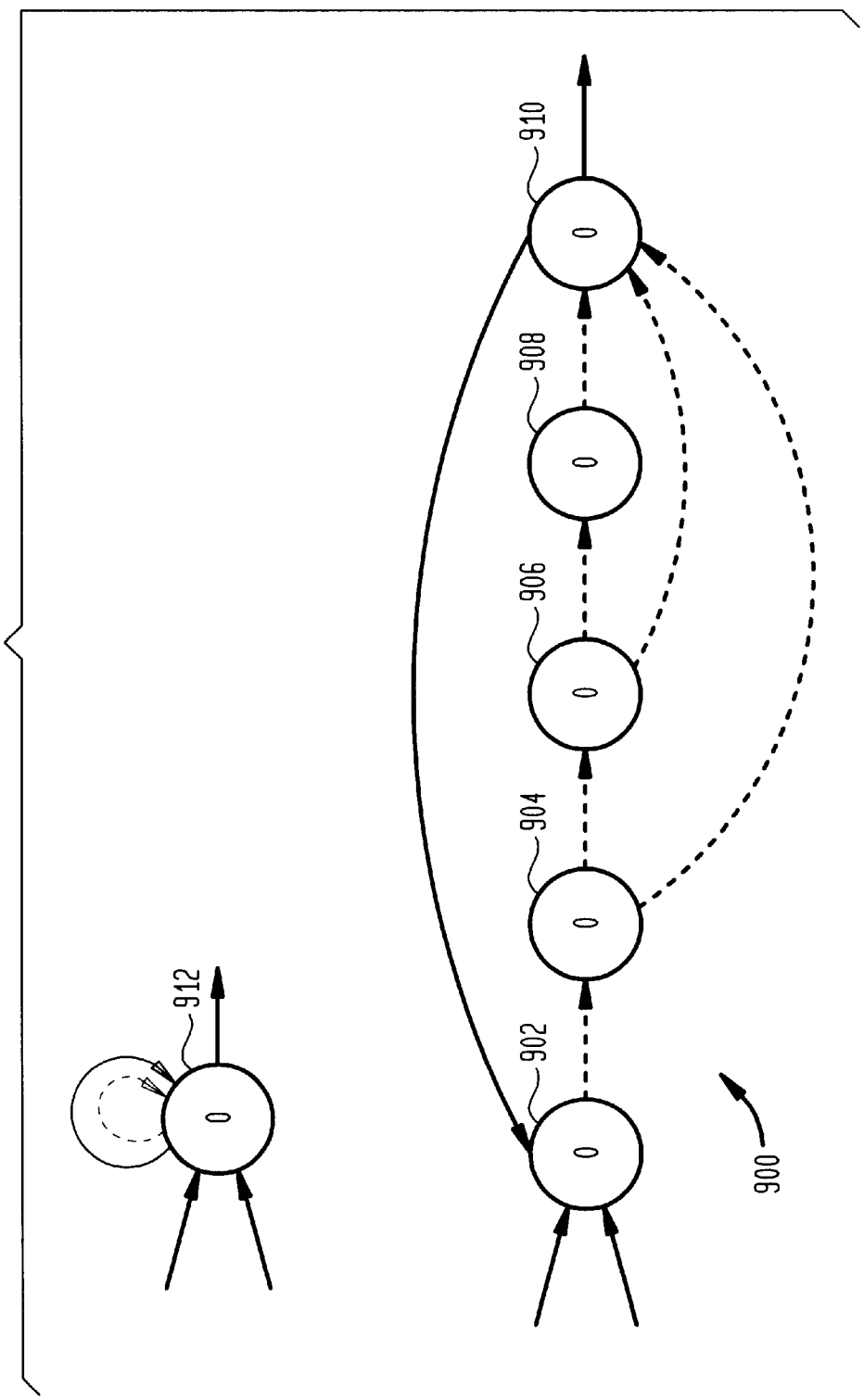
FIG. 9 illustrates equivalency between an exemplary node subject to constraints, and an exemplary trellis comprising a sequence of unconstrained nodes, suitably constructed and employed by a repeater according to the present invention.

This condition does not hold in the system described above, due to duration constraints. A sub-path of an optimal path may not be optimal because there may be a better sub-path which could not be extended due to the temporal constraints. This is the reason for relaxing the temporal constraints about a bad frame. If temporal constraints are not relaxed, it may be possible to choose an optimal path during the bad frame, only to have that path be terminated later because of the temporal constraints. At the same time, a path which had a somewhat worse score than the one chosen, but which could meet temporal constraints later, might be rejected. The relaxation of temporal constraints for nodes which are entered during a bad frame alleviates the problem but does not guarantee optimality. As an alternative, the following solution may be used to resolve this problem. The observation interval is kept fixed and nodes with duration constraints are replaced by sequences of nodes without temporal constraints. As a result, in each adaptation step, all arcs are allowed at any time, the dynamic programming principle applies and unmodified Viterbi decoding is used to find the optimal solution. An example of a modified trellis 900 adapted to this method is shown in FIG. 9. In FIG. 9, it can be seen how the trellis 900, comprising a sequence of five nodes 902, 904, 906, 908 and 910 with appropriate arcs and without temporal constraints, is equivalent to a single node 912 with the constraint of duration between 3 and 5.

The number of nodes in the sequence is the maximum duration of the constrained node, measured in observation intervals. Each node except for the last one is connected to the next node in the sequence by a dashed line arc. Let the nodes in the sequence be indexed by 1,2,M where M is the maximal duration allowed. Let m be the minimum duration allowed in this mode (assume m>1; m=1 is unlikely to occur). Then nodes m−1, m, m+1, . . . M−2 should be connected to node M by dashed line arcs. Next, all solid line arcs which had the original node as destination are given the first node as their destination. Finally, all solid line arcs which had the original node as their source are given the final node as their source.

Figure 10:
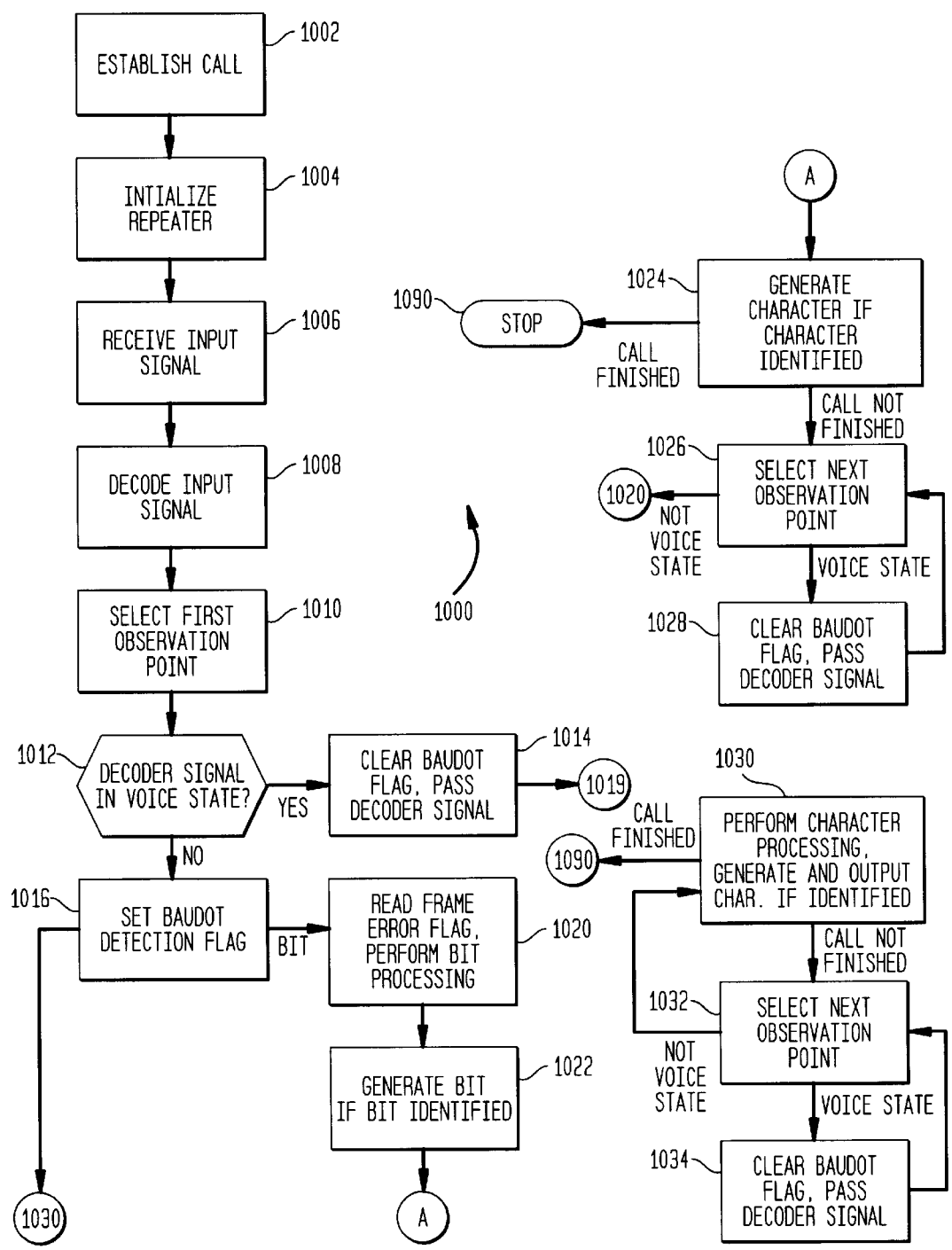
FIG. 10 illustrates the steps of a method of teletype-capable telephony in accordance with the present invention.

FIG. 10 illustrates the steps of a method of TTY-capable telephony 1000 in accordance with the present invention. At step 1002, an incoming call is detected by a TTY-capable digital wireless telephone receiver such as the receiver 100 of FIG. 1. At step 1004, a repeater such as the repeater 102 of FIG. 1 is initialized. Initialization comprises setting of initial states and selection of observation points and observation intervals. At step 1006, the telephone receiver receives an input signal. At step 1008, the telephone receiver decodes the input signal. Decoding comprises processing the input signal into a series of speech frames, and as each speech frame is generated, examining the speech frame to determine if it is bad and setting a frame error flag if it is bad. Next, the input signal is processed by a repeater such as the repeater 102 of FIG. 1. At step 1010, the repeater selects the first observation point. At step 1012, the repeater examines the decoder signal produced by the decoder to determine if it is in the voice state. If the decoder signal is in the voice state, the process continues to step 1014, a Baudot detection flag is cleared and the decoder signal is passed unchanged as the output of the telephone receiver. The process then continues to step 1019, the next observation point is selected, and the process returns to step 1012. If the signal is not in the voice state, the process continues to step 1016, the Baudot detection flag is set, and the repeater performs further processing. The additional processing steps depend on the design of the repeater. It is anticipated that a repeater will be designed to perform either bit level processing or character level processing, and will not be designed with the capability to select one or the other of the processing modes. It is, however, possible to design a repeater with such a selection capability.

If the telephone receiver is operating at the bit level, the process continues to step 1020, the repeater reads the frame error flag and performs bit level processing. Next, the process continues to step 1022 and if sufficient observation points have been processed to identify a bit, the repeater identifies and generates a bit. Next, the process continues to step 1024, and if sufficient bits have been generated to form a character, the character is produced as output of the telephone receiver. Next, if the call is finished, the process terminates at step 1090. If the call has not finished, the process continues to step 1026 and the repeater selects the next observation point. If the observation point shows that the signal is in the voice state, the process continues to step 1028 and the Baudot detection flag is cleared and the decoder output is passed as the output of the telephone receiver. The process then returns to step 1026. If the signal is not in the voice state, the process returns to step 1020.

If the telephone receiver is operating at the character level, the process continues to step 1030, the repeater reads the frame error flag and performs character level processing and, if sufficient observation points have been processed to identify a character, the repeater identifies and generates the character, which is then produced as the output of the telephone receiver. Next, if the call is finished, the process terminates at step 1090. If the call has not finished, the process continues to step 1032 and the repeater selects the next observation point. If the observation point shows that the signal is in the voice state, the process continues to step 1034 and the Baudot detection flag is cleared and the decoder output is passed as the output of the telephone receiver. The process then returns to step 1032. If the signal is not in the voice state, the process returns to step 1030.

Viterbi decoding, such as the Viterbi decoding discussed above in connection with FIGS. 2–9, guarantees optimal solution. Alternative methods do exist, however, which may provide a near-optimal solution, with simpler implementation. As an example, a heuristic method of decoding may suitably be implemented.

Figure 11:
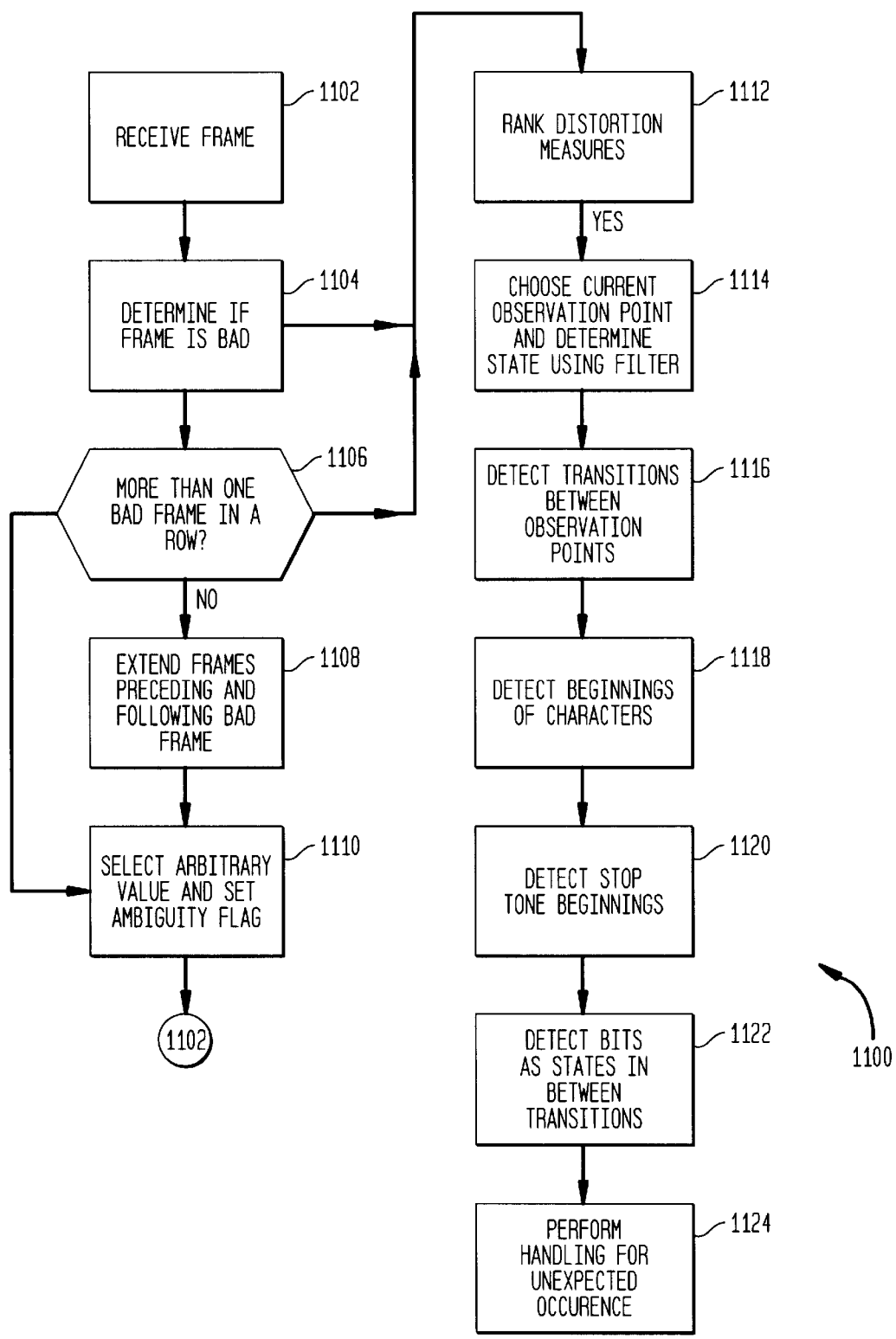
FIG. 11 illustrates the steps of a method of heuristic signal interpretation and generation according to the present invention.

FIG. 11 illustrates the steps of a method 1100 of heuristic decoding in accordance with the present invention. At step 1102, a frame is received for processing. In addition to the frame received for processing, several other adjacent frames are buffered in order to provide for bad frame handling. Next, at step 1104, a determination is made whether the received frame is bad. If the received frame is not bad, the process continues to step 1112. If the received frame is bad, the process proceeds to step 1106 and a determination is made as to whether the received frame immediately follows a previous bad frame. If the received frame is bad, and immediately follows a bad frame, at least one bit is completely unobserved. In that case, step 1110 is executed, an arbitrary value is selected, and an ambiguity flag is set and the process returns to step 1102. If the received frame is bad, but does not immediately follow a bad frame, step 1108 is executed and the state last observed before the received frame is extended until a point which is one bit duration after that last observed transition, and the state first observed in the frame following the received frame is extended backwards to that point. The process then continues to step 1112. At step 1112, distortion measures at each observation point are ranked by their value. Next, at step 1114, one of the observation points is chosen as the current observation point and a rank order filter is used over the current observation point and some neighboring observation points to determine the state of the current observation point. Next, at step 1116, transitions are detected as changes in state between adjacent observation points. Next, at step 1118, beginnings of characters are detected as transitions between Q or stop-tones and 0. Next, at step 1120, stop tone beginnings are detected as transitions occurring 6 bits after character beginnings. Next, at step 1122, bits are detected as states in between transitions.

Steps 1102 through 1122 above properly decode the expected behavior of a Baudot signal. They do not deal with a signal which does not behave as expected. This unexpected behavior may occur, for example, if a transition occurs where it is not expected to occur, or if an illegal type of transition happens, for example Q>1 or 0>Q). In this case, step 1124 is executed and the decision is made either to determine that the observed signal is not a Baudot signal and treat it as speech or, alternatively, to apply a heuristic or arbitrary correction to the estimated state sequence in order to make it conform to the Baudot structure. The choice between alternatives is suitably determined when designing the system, and if the choice is made to apply a correction to the state sequence, the correction chosen is made according to individual design choices.

While the present invention is disclosed in the context of a presently preferred embodiment, it will be recognized that a wide variety of implementations may be employed by persons of ordinary skill in the art consistent with the above discussion and the claims which follow below.

I claim:

1. A Baudot repeater for use in a digital wireless teletype-capable telephone receiver, comprising:
    an input for receiving a repeater input signal representing a plurality of speech frames, each frame comprising a plurality of samples, one or more of the speech frames comprising a sequence of Baudot characters;
    a Baudot receiver for cxamining a plurality of observation points within the repeater input signal, the plurality of observation points defined as points in time at which distortion measures are computed, the observation points being separated by an observation interval; and
    means for estimating a sequence of data items representing the sequence of Baudot characters represented by the repeater input signal, the estimating means using distortion data gathered from the observation points.

2. The Baudot repeater of claim 1 wherein the Baudot receiver further comprises:
    a frame error flag input for receiving a frame error flag indicating whether the speech frame associated with the frame enor flag defines a bad frame, and wherein the Baudot receiver is operative to perform error handling on the repeater input signal to recover a data item partially lost within the bad frame.

3. The Baudot repeater of claim 2 wherein the error handling is performed by examining a frame preceding the bad frame and a frame following the bad frame to identify information representing a data item occurring partially within the bad frame and partially within the frame preceding or following the bad frame in order to identify the data item partially lost within the bad frame.

4. The Baudot repeater of claim 3 wherein the estimating means comprises:
    an input for receiving the repeater input signal;
    means for computing a distortion measure for the repeater input signal at each of the plurality of observation points, an observation interval occurring between observation points;
    a trellis structure which is fed the distortion measures, the trellis structure having a plurality of nodes and a plurality of arcs, with each arc originating from a node defining a source node and terminating to a node defining a destination node; and
    a processor having a program for running a modified Viterbi algorithm in order to decode the sequence of data items represented by the signal.

5. The Baudot repeater of claim 4 wherein each data item is a bit.

6. The Baudot repeater of claim 4 wherein each data item is a character.

7. The Baudot repeater of claim 6 wherein the observation points are chosen so that the last sample in each frame is an observation point.

8. The Baudot repeater of claim 7 wherein the Baudot receiver does not compute distortion measures for a bad frame.

9. The Baudot repeater of claim 8 further comprising:
    means for setting each node in the trellis structure to an initial state;
    means for updating node variables of each node of the trellis structure; and
    means for detecting frame information and classification information, the frame information comprising the beginning and ending times of each bit and the beginning and ending times of each character, the classification information comprising the contents of each bit.

10. The Baudot repeater of claim 9, wherein the means for updating comprises:
    means for selecting a node from the trellis structure;
    means for determining if a transition along any arc connecting to the node is allowed;
    means for assigning the source node variables to arc variables for each arc in the trellis structure, the arc variables comprising score data representing the likelihood that the optimal path through the trellis structure will be through this arc;
    means for performing a search over all arcs which have the node as a destination node and selecting the arc having a minimum score;
    means for assigning the arc variables of the arc having the minimum score to the node variables;
    means for adding a distortion measure of the state of the node to the score of the node;
    means for determining if each node o f the trellis structure has been updated; and
    means for selecting.the node with the minimum score.

11. The Baudot repeater of claim 10 wherein the means for updating is further operative to subtract the minimum score from the scores of each node of the trellis structure.

12. The Baudot repeater of claim 2 and also including a transmitter operative to receive instructions from the Baudot repeater identifying the data items detected, and to transmit representations of the data items based on the instructions.

13. The Baudot repeater of claim 6 wherein the observation interval is reduced by an integer factor during a fixed time segment before a bad frame.

14. The Baudot repeater of claim 9 wherein the means for detecting comprises:
    means for maintaining a trace representing the sequence of bits that have been completed before entering the node with the minimum score;
    means for examining the node variables of the node with the minimum score to determine if it is a detection state;
    means for examining the detection state to determine if it is a voice state;
    means for clearing a Baudot detection flag;
    means for examining the operation mode to determine whether operation is occurring on the bit level or the character level;
    means for reporting the earliest bit in the trace;
    means for removing the bit from the trace;
    means for clearing an ambiguity flag;
    means for setting a Baudot detection flag; and
    means for reping the earliest 7 bits in the trace.

15. A method of wireless digital teletype-capable telephony comprising the steps of:
    receiving a repeater input signal representing a plurality of speech frames, each frame comprising a plurality of samples, one or more of the speech frames comprising a sequence of Baudot characters;
    examining a plurality of observation points within the repeater input signal, the plurality of observation points defined as points in time at which distortion measures are computed, the observation points being separated by observation intervals; and identifying distortion data gathered from the observation points to estimate a sequence of data items representing the sequence of Baudot characters represented by the repeater input signal.

16. The method of claim 15 further comprising the step of:

receiving a frame error flag in the event of a bad frame and processing the frames preceding and following the bad frame in order to estimate the data represented by the bad frame.

17. The method of claim 16 wherein the step of identifying distortion data comprises:

computing a distortion measure for the repeater input signal at each of a plurality of observation points;

feeding the distortion measures into a trellis structure comprising aplurality of nodes and a plurality of arcs, with each arc originating from a node defining a source node and terminating to a node defining a destination node, the plurality of nodes characterized by constraints on individual nodes and relationships between nodes; and decoding the sequence of Baudot characters represented by the input signal using a modified Viterbi algorithm.

18. The method of claim 17 wherein the observation interval is chosen so that the last sample in each frame is an observation point.

19. The method of claim 18 wherein the decoding step comprises:

setting each node in the trellis structure to an initial state;

updating node variables of each node of the trellis structure; and performing detection of frame information and classification information, the frame information comprising the beginning and ending times of each bit and the beginning and ending times of each character, the classification information comprising the contents of each bit.

20. The method of claim 19 wherein the step of updating node variables of each node of the trellis structure comprises the steps of:

for each arc connecting to a node in the trellis structure, determining if a transition along that arc is allowed;

for each arc having an allowed transition, assigning the source node variables to arc variables for each arc in the trellis structure, the arc variables comprising score data representing the likelihood that the optimal path through the trellis structure will be through this arc;

selecting a node from the trellis structure;

performing a search over all arcs which have the node as a destination node and selecting the arc having a minimum score;

assigning the arc variables of the arc having the miniuum score to the node variables;

adding a distortion measure of the state of the node is added to the score of the node;

determining if each node of the trellis structure has been updated;

if each node of the trellis structure has not been updated, selecting the next node and repeating the process beginning with selecting a node; and if each node of the trellis structure has been updated, selecting the node with the minimum score.

21. The method of claim 20, wherein the step of selecting the node with the minimum score is followed by the step of subtracting the minimum score from the scores of each node of the trellis structure.

22. The repeater of claim 20 wherein the receiver is operative to stabilize a phase of the receiver input signal.

23. The repeater of claim 18 wherein the receiver is operative to stabilize an amplitude of the receiver input signal.

24. A Baudot repeater for use in a digital wireless teletype-capable telephone receiver, comprising:

a frame input for receiving a receiver input signal representing a plurality of speech frames, each frame comprising a plurality of samples, one or more of the speech frames comprising a sequence of Baudot characters; and a Baudot receiver operative to pass Frequency Shift Key signals and stop other frequencies to produce a Baudot receiver signal; and a transmitter operative to pass the Baudot receiver signal as the output signal.

* * * * *